(12) United States Patent
Berman

(10) Patent No.: US 10,573,390 B1
(45) Date of Patent: Feb. 25, 2020

(54) HIGH-DENSITY STORAGE SYSTEM

(71) Applicant: SAMSUNG ELECTRONICS CO., LTD., Suwon-si (KR)

(72) Inventor: Amit Berman, Ramat Gan (IL)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/206,357

(22) Filed: Nov. 30, 2018

(51) Int. Cl.
*G11C 16/10* (2006.01)
*G11C 16/04* (2006.01)
*G11C 29/42* (2006.01)
*G11C 16/08* (2006.01)
*G11C 11/56* (2006.01)
*G06N 3/02* (2006.01)
*G06N 7/00* (2006.01)
*G11C 29/04* (2006.01)

(52) U.S. Cl.
CPC ............... *G11C 16/10* (2013.01); *G06N 3/02* (2013.01); *G06N 7/005* (2013.01); *G11C 11/5628* (2013.01); *G11C 11/5642* (2013.01); *G11C 16/0483* (2013.01); *G11C 16/08* (2013.01); *G11C 29/42* (2013.01); *G11C 2029/0411* (2013.01)

(58) Field of Classification Search
CPC ...... G11C 16/10; G11C 11/5628; G11C 29/42
USPC .......................... 365/185.09, 230.01, 185.03
See application file for complete search history.

(56) References Cited

U.S. PATENT DOCUMENTS

2015/0229337 A1* 8/2015 Alhussien ............. H03M 13/35
                                                                    714/773
2018/0024881 A1* 1/2018 Lu ........................ G06F 11/1012

* cited by examiner

*Primary Examiner* — Han Yang
(74) *Attorney, Agent, or Firm* — Sughrue Mion, PLLC

(57) ABSTRACT

A high-density storage system includes a memory device, and a controller including a range allocation and program order block configured to determine a range of a threshold voltage for each level of each memory cell of the memory device, based on initial data and an interference in the memory device, and determine an order in which groups of memory cells of the memory device are programmed, based on the interference. The controller further includes a statistical cell correction block configured to perform statistical cell correction on the range of the threshold voltage for each level of each memory cell, based on the order in which the groups of the memory cells are programmed and reference information of each level of each memory cell of the memory device that is received from the memory device.

20 Claims, 7 Drawing Sheets

HIGH-DENSITY STORAGE SYSTEM

BACKGROUND

1. Field

Apparatuses and methods consistent with embodiments relate to a solid-state drive (SSD), namely, a high-density storage system.

2. Description of Related Art

An SSD is a solid-state storage device using integrated circuits as memory to store data persistently. Because an SSD uses no moving mechanical components, compared with a hard disk drive (HDD), an SSD is more resistant to physical shock, runs silently, has quicker access time, and has lower latency.

An SSD may include multi-level cells (MLCs), each of which being a memory element capable of storing more than a single bit of data. The primary benefit of MLCs is their lower cost per unit of storage due to the higher data density. However, as the number of levels per memory cell increases in SSDs, a resulting bit error rate in each SSD increases as well.

SUMMARY

According to embodiments, there is provided a high-density storage system including a memory device, and a controller including a range allocation and program order block configured to determine a range of a threshold voltage for each level of each memory cell of the memory device, based on initial data and an interference in the memory device, and determine an order in which groups of memory cells of the memory device are programmed, based on the interference. The controller further includes a statistical cell correction block configured to perform statistical cell correction on the range of the threshold voltage for each level of each memory cell, based on the order in which the groups of the memory cells are programmed and reference information of each level of each memory cell of the memory device that is received from the memory device, and an incremental step pulse programming (ISPP) tuner and error correction code (ECC) encoder block configured to determine a magnitude of an ISPP pulse to applied to each level of each memory cell of the memory device, based on a result of the statistical cell correction that is performed, perform ECC encoding on the magnitude of the ISPP pulse to be applied to each level of each memory cell, and apply, to each level of each memory cell of the memory device, the magnitude of the ISPP pulse on which the ECC encoding is performed.

According to embodiments, there is provided a method of controlling a high-density storage system including determining a range of a threshold voltage for each level of each memory cell of a memory device, based on initial data and an interference in the memory device, determining an order in which groups of memory cells of the memory device are programmed, based on the interference, and performing statistical cell correction on the range of the threshold voltage for each level of each memory cell, based on the order in which the groups of the memory cells are programmed and reference information of each level of each memory cell of the memory device that is received from the memory device. The method further includes determining a magnitude of an ISPP pulse to applied to each level of each memory cell of the memory device, based on a result of the statistical cell correction that is performed, performing encoding on the magnitude of the ISPP pulse to be applied to each level of each memory cell, and applying, to each level of each memory cell of the memory device, the magnitude of the ISPP pulse on which the ECC encoding is performed.

According to embodiments, there is provided a non-transitory computer-readable storage medium storing instructions to cause a processor to determine a range of a threshold voltage for each level of each memory cell of a memory device, based on initial data and an interference in the memory device, determine an order in which groups of memory cells of the memory device are programmed, based on the interference, and perform statistical cell correction on the range of the threshold voltage for each level of each memory cell, based on the order in which the groups of the memory cells are programmed and reference information of each level of each memory cell of the memory device that is received from the memory device. The instructions further cause the processor to determine a magnitude of an ISPP pulse to applied to each level of each memory cell of the memory device, based on a result of the statistical cell correction that is performed, perform ECC encoding on the magnitude of the ISPP pulse to be applied to each level of each memory cell, and apply, to each level of each memory cell of the memory device, the magnitude of the ISPP pulse on which the ECC encoding is performed.

DETAILED DESCRIPTION

Figure 1:
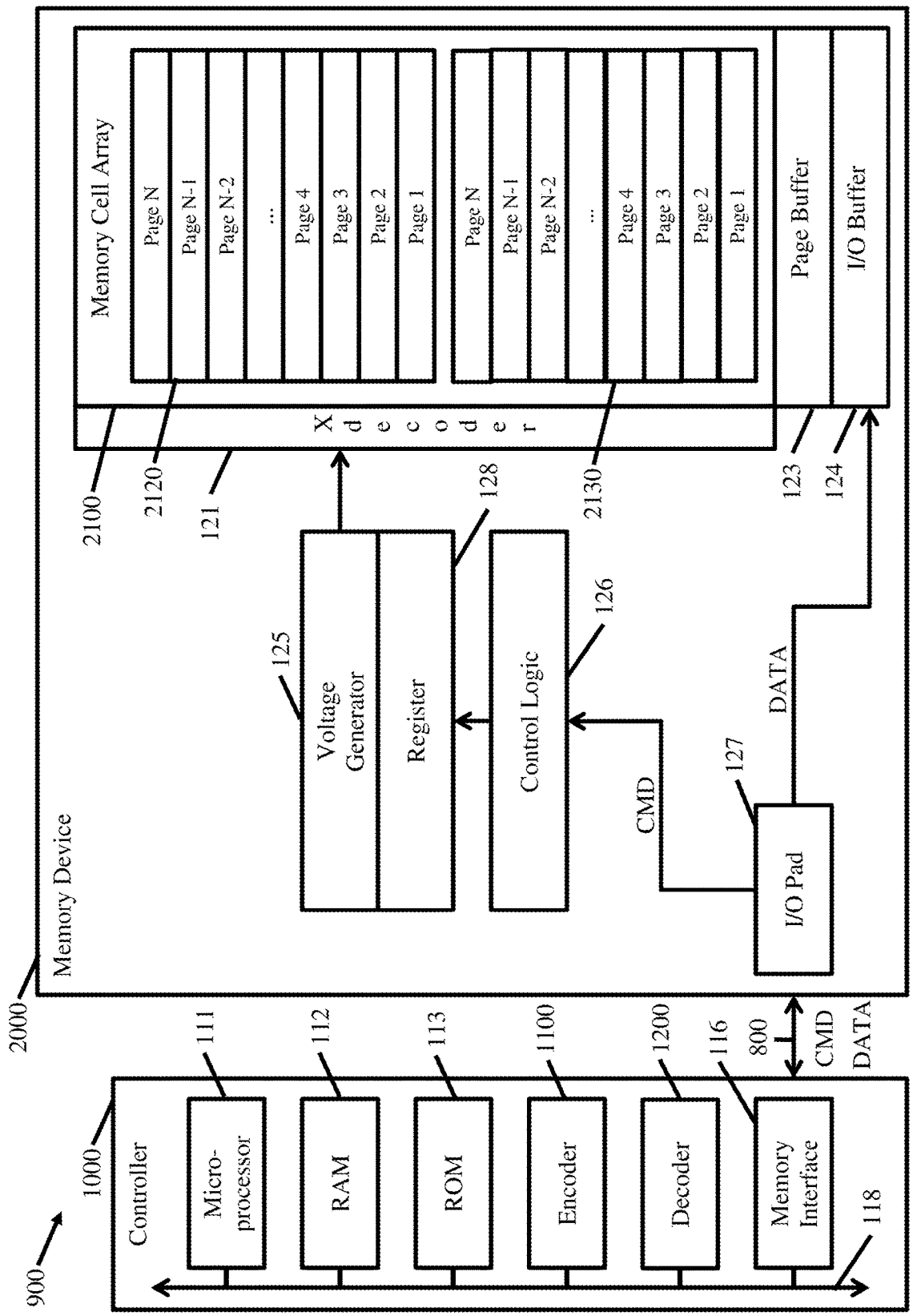
FIG. 1 is a block diagram of a memory system according to embodiments.

FIG. 1 is a block diagram of a memory system 900 according to embodiments. Referring to FIG. 1, the memory system 900 includes a memory controller 1000 and a non-volatile memory device 2000. The memory system 900 may be an SSD including form factors such as memory card form factors including Secure Digital and variations thereof, and etc., as standard HDD form factors, standard card form factors, including mini-Serial AT Attachment (mSATA), PCI Express Mini Card, M.2, etc., disk-on-a-module form factors with interfaces such as Parallel ATA (PATA) or SATA, box form factors for applications such as rack-mount systems, bare-board form factors including PCI Express (PCIe), mini PCIe, mini-DIMM (dual in-line memory module), MO-297, etc., and ball grid array form factors.

The nonvolatile memory device 2000 may be, but is not limited to, a flash memory device, a NAND flash memory device, a phase change RAM (PRAM), a ferroelectric RAM (FRAM), a magnetic RAM (MRAM), etc. The nonvolatile memory device 2000 may have a planar structure or a three-dimensional (3D) memory cell structure with a stack of memory cells. Each of the memory cells may include levels to store respective bits of data. The nonvolatile memory device 2000 may be implemented, for example, as a memory chip (e.g., a NAND chip). Though, for the purpose of simplicity, only one nonvolatile memory device 2000 is illustrated in FIG. 1, the memory system 900 may include several nonvolatile memory devices (e.g., memory chips) arranged in multiple ways and connected to the controller 1000 via multiple channels.

The nonvolatile memory device 2000 may include a memory cell array 2100, an X decoder 121, a voltage generator 125, an I/O buffer 124, a page buffer 123, and a control logic 126 each of which may be implemented as one or more circuits. The memory device may also include an input/output (I/O) pad 127.

The memory cell array 2100 includes a plurality of word lines W/L and a plurality of bit lines B/L. Each memory cell may be implemented, for example, as a memory cell having a floating gate or a charge storage layer such as a charge trapping layer, or any other type of memory cell capable of storing one or more bits of data.

The memory cell array 2100 may include a plurality of blocks and a plurality of pages. One block includes a plurality of pages. A page may be a unit of program and read operations, and a block may be a unit of an erase operation. For example, the memory cell array 2100 includes a first block 2120 and a second block 2130. As is illustrated n FIG. 1, according to embodiments of the inventive concepts, the first block 2120 includes pages 1-N, and the second block 2130 includes pages 1-N, where N is a positive integer greater than 1.

The control logic 126 controls the overall operation of the nonvolatile memory device 2000. When receiving a command CMD from the memory controller 1000, the control logic 126 interprets the command CMD and controls the nonvolatile memory device 2000 to perform an operation (e.g., a program operation, a read operation, a read retry operation, or an erase operation) according to the interpreted command CMD.

According to embodiments, the control logic 126 may include a hardware-implemented processor configured to execute commands based on command signal CMD. According to embodiments of the inventive concepts, in addition to the processor, the control logic 126 may also include a storage unit for storing steps that, when executed by the processor included in the control logic 126, cause the processor to perform specific operations. According to embodiments of the inventive concepts, any operations described herein as being performed by the memory device 2000 may be performed by, or under the control of, the control logic 126, for example, by the processor included in the control logic 126 driving firmware stored in the storage unit included in the control logic 126. Alternatively, the control logic 126 may be a circuit (e.g. an application specific integrated circuit (ASIC) or field programmable gate array (FPGA)) that is physically programmed, in terms of hardware, to perform or control any operations described herein as being performed by the memory device 2000.

The X decoder 121 is controlled by the control logic 126 and drives at least one of the word lines W/L in the memory cell array 2100 according to a row address.

The voltage generator 125 is controlled by the control logic 126 to generate one or more voltages required for a program operation, a read operation or an erase operation and provide the generated voltages to one or more rows selected by the X decoder 121.

A register 128 is controlled by the control logic 126 and is a space in which information input from the memory controller 1000 is stored and may include a plurality of latches. For example, the register 128 may group read voltage (and/or reference voltage) information and store the information in the form of a table.

The page buffer 123 is controlled by the control logic 126 and operates as a sense amplifier or a write driver according to an operation mode (e.g., a read operation or a program operation).

The I/O pad 127 and the I/O buffer 124 may serve as I/O paths of data exchanged between an external device, e.g., the memory controller 1000 or a host and the nonvolatile memory device 2000. The I/O pad 127 is connected to the controller 1000 through a memory system bus 800. Data and or commands may be output from the memory device 2000 to the controller 1000 or received from the controller 1000 at the memory device 2000 via the I/O pad 127 and the memory system bus 800.

Returning to FIG. 1, the memory controller 1000 may include a microprocessor 111, a read-only memory (ROM) 113, a random access memory (RAM) 112, an encoder 1100, a decoder 1200, a memory interface 116, and a controller bus 118. The elements 111 through 116 of the memory controller 1000 may be electrically connected to each other through the controller bus 118.

The microprocessor 111 controls the overall operation of the memory system 900 including the memory controller 1000. The microprocessor 111 is a circuit that controls other elements by generating control signals. When power is supplied to the memory system 900, the microprocessor 111 drives firmware (e.g., stored in the ROM 113) for operating the memory system 900 on the RAM 112, thereby controlling the overall operation of the memory system 900. According to embodiments of the inventive concepts, the microprocessor 111 may also issue steps for controlling operations of other elements of the memory controller 1000 including, for example, some or all of the ROM 113, the RAM 112, the encoder 1100, the decoder 1200, the memory interface 116, and the controller bus 118. According to embodiments of the inventive concepts, any operations described herein as being performed by the memory controller 1000 may be performed by, or under the control of, the microprocessor 111, for example, by the microprocessor driving the above-referenced firmware.

While a driving firmware code of the memory system 900 is stored in the ROM 113, one or more example embodiments of the inventive concepts are not limited thereto. The firmware code can also be stored in a portion of the nonvolatile memory system 900 other than the ROM 113. Therefore, the control or intervention of the microprocessor 111 may encompass not only the direct control of the microprocessor 111 but also the intervention of firmware which is software driven by the microprocessor 111.

Alternatively, the microprocessor 111 may be a circuit (e.g. an ASIC or FPGA) that is physically programmed, in terms of hardware, to perform or control any operations described herein as being performed by the memory controller 1000.

The RAM 112, which is a memory serving as a buffer, may store an initial command, data, and various variables input from a host or the microprocessor 111, or data output from the nonvolatile memory device 2000. The RAM 112 may store data and various parameters and variables input to and output from the nonvolatile memory device 2000. According to at least some example embodiments of the inventive concepts, the RAM 112 may store an instruction queue, which includes a list of pending memory device access instructions (e.g. data read requests and data write requests for the memory device 2000).

The memory interface 116 may serve as an interface between the memory controller 1000 and the nonvolatile memory device 2000. The memory interface 116 is connected to the I/O pad 127 of the nonvolatile memory device 2000 via the memory system bus 800 and may exchange data with the I/O pad 127 via the memory system bus 800. In addition, the memory interface 116 may create a command suitable for the nonvolatile memory device 2000 and provide the created command to the I/O pad 127 of the nonvolatile memory device 2000. The memory interface 116 provides a command to be executed by the nonvolatile memory device 2000 and an address ADD of the nonvolatile memory device 2000.

According to embodiments of the inventive concepts, the decoder 1200 may be an error correcting code (ECC) decoder, and the encoder 1100 may be an ECC encoder. According to embodiments of the inventive concepts, the decoder 1200 and the encoder 1100 perform error bit correction. The encoder 1100 may generate data added with one or more parity and/or redundancy bits by performing error correction encoding on data before the data is provided to the nonvolatile memory device 2000. The one or more parity and/or redundancy bits may be stored in the nonvolatile memory device 2000.

Each of the encoder 1100 and the decoder 1200 may include an error correction circuit, system or device.

Figure 2:
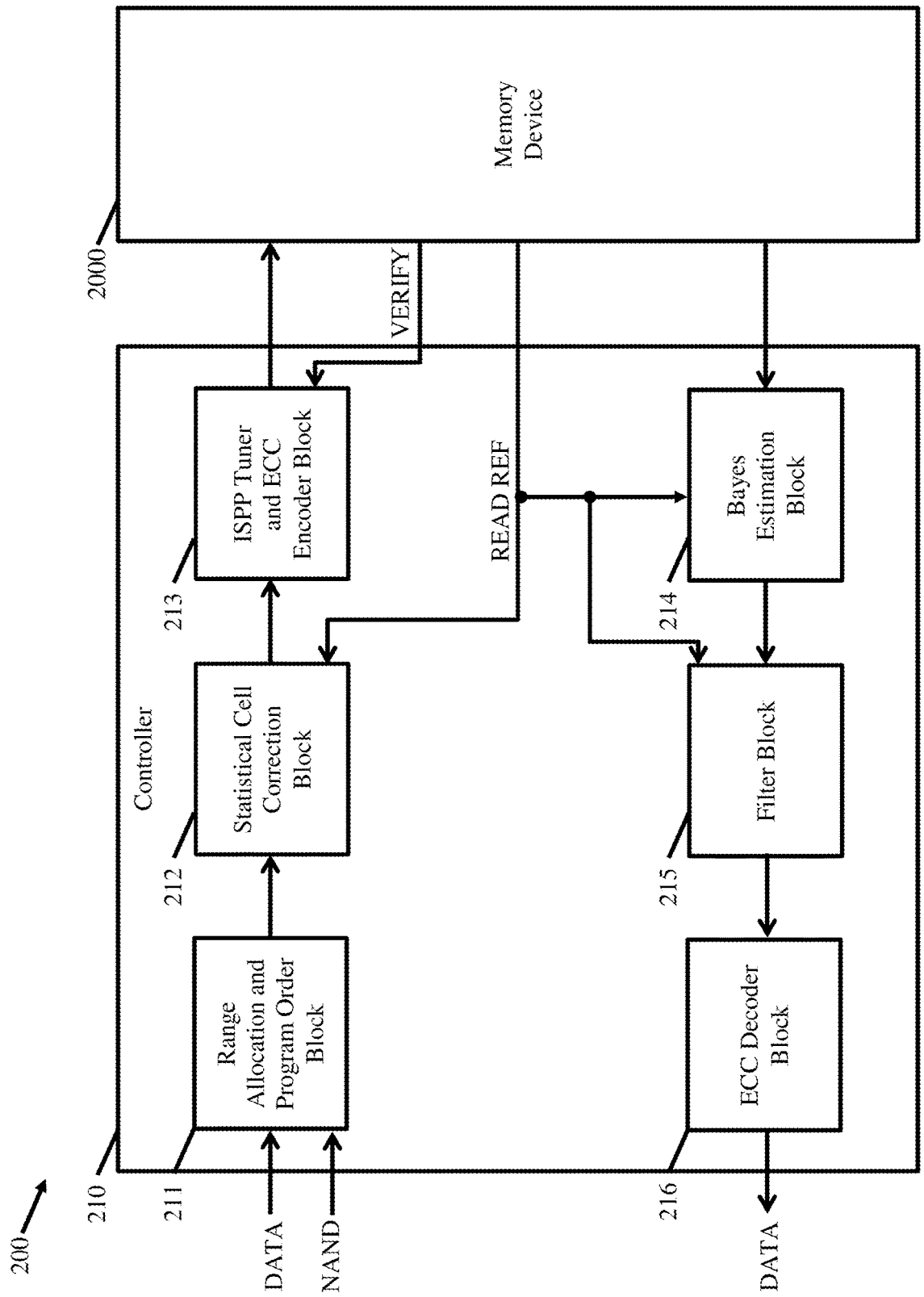
FIG. 2 is a block diagram of a memory system according to embodiments.

FIG. 2 is a block diagram of a memory system 200 according to embodiments.

Referring to FIG. 2, the memory system 200 includes a controller 210 and the memory device 2000. The controller 210 includes a range allocation and program order block 211, a statistical cell correction block 212, an incremental step pulse programming (ISPP) tuner and error correction code (ECC) encoder block 213, a Bayes estimation block 214, a filter block 215, and an ECC decoder block 216.

The range allocation and program order block 211 receives initial data DATA that may be a binary vector, and converts the initial data DATA to a range of a threshold voltage $V_T$ for each level of each memory cell of the memory device 2000, to balance an equal amount of errors between each level. For example, a first group of the memory cells may each have a first range of the threshold voltage $V_T$ for each level, namely, −3 volts (V) to 5.5 V, to correspond to a bit '0' of the initial data DATA. A second group of the memory cells may each have a second range of the threshold voltage $V_T$ for each level, namely, 9 V to 10 V, to correspond to a bit '1' of the initial data DATA.

The range allocation and program order block 211 determines the range of the threshold voltage $V_T$ for each level of each memory cell, further based on an interference between a word line of each memory cell and its surroundings. The interference may refer to noise and be indicated by the term "NAND" as shown in FIG. 2. The interference may be a predetermined value for each word line of the memory device 2000. Alternatively, the interference may be determined through machine learning.

The range allocation and program order block 211 further determines which groups of memory cells of the memory device 2000 are programmed separately in an order of program stages, to minimize cell-to-cell coupling. That is, the range allocation and program order block 211 determines an order in which the groups of the memory cells are programmed, based on inter-cell interference in each bit line, ready-for-verify interference in each word line, and pillar interference on a z-axis, to mitigate such interferences. The interferences may be indicated by the term "NAND" as shown in FIG. 2, and be predetermined values. Alternatively, the interferences may be determined through machine learning. For example, to decrease the interferences, a first group of the memory cells each having a mid-level range of the threshold voltage $V_T$ for each level, may be programmed before a second group of the memory cells each having a higher-level range of the threshold voltage $V_T$ for each level.

The statistical cell correction block 212 determines an actual threshold voltage $V_T$ of each level of each memory cell of the memory device 2000, based on a read reference READ REF that is received from the memory device 2000. The read reference READ REF indicates a positive movement or increase of the threshold voltage $V_T$ of at least one level of at least one memory cell, and also a previous program pulse that is applied to each level of each memory cell. The statistical cell correction block 212 further determines a negative movement or decrease (i.e., a retention rate) of the threshold voltage $V_T$ of at least one level of at least one memory cell, between program pulses that are applied to each level of each memory cell. The positive movement may be due to a write pulse or an interference, while the negative movement may be due to leakage or a retention phenomenon. The read reference READ REF may be a binary vector that is a result of comparing the actual voltage threshold $V_T$ of each level of each memory cell to a reference value.

The statistical cell correction block 212 further determines an additional program pulse to be applied to at least one level of at least one memory cell of the memory device 2000 that is predicted for shifting respectively of the actual threshold voltages $V_T$, based on the determined actual threshold voltage $V_T$ of each level of each memory cell of the memory device 2000, and the range of the threshold voltage $V_T$ for each level of each memory cell that is determined by the range allocation and program order block 211. In this way, the statistical cell correction block 212 determines whether the additional program pulse is added to each level of each memory cell such that each level is over its range of the threshold voltage $V_T$. The statistical cell correction block 212 may further calculate the additional program pulse to be applied to at least one level of at least one memory cell, further based on the order in which the groups of the memory cells are programmed that is determined by the range allocation and program order block 211.

The ISPP tuner and ECC encoder block 213 determines a magnitude of an ISPP pulse to be applied to each level of each memory cell of the memory device 2000, based on a verify signal VERIFY and the respective additional program pulse determined by the statistical cell correction block 212, to achieve a minimum bit error rate (BER). The verify signal VERIFY is received from the memory device 2000 and indicates whether each level of each memory cell reaches the determined range of the threshold voltage $V_T$.

The ISPP tuner and ECC encoder block 213 further performs ECC encoding of the determined magnitude of the ISPP pulse to be applied to each level of each memory cell of the memory device 2000. The ISPP tuner and ECC encoder block 213 then applies the ECC-encoded magnitude of the ISPP pulse, to each level of each memory cell.

The Bayes estimation block 214 performs a Bayes estimation on data that is received from the memory device 2000, to remove noise from the data. The Bayes estimation block 214 may perform the Bayes estimation, based on the read reference READ REF that is received from the memory device 2000.

The filter block 215 filters the data on which the Bayes estimation is performed, to remove bit redundancy from the data. The filter block 215 may include, for example, a Kalman filter or a Weiner filter. The filter block 215 may filter the data on which the B ayes estimation is performed, based on the read reference READ REF that is received from the memory device 2000.

The ECC decoder block 216 performs an ECC decoding of the data that is filtered, to regenerate the initial data DATA.

The controller 210 may perform periodic read-and-program of data (i.e., data refresh), and the memory system 200 may use a constant connection to a power source.

According to embodiments, the memory system 200 enables reliable storage of, for example, 64-levels per memory cell. The memory system 200 has the bit cost and performance of hard disk drives (HDDs), but also the power consumption, form factor and solid-state reliability over HDDs. Further, the memory system 200 achieves a bit error rate (BER) less than that of conventional memory systems, so that soft-decision (SD) decoding is enabled using existing ECC solutions.

Figure 3:
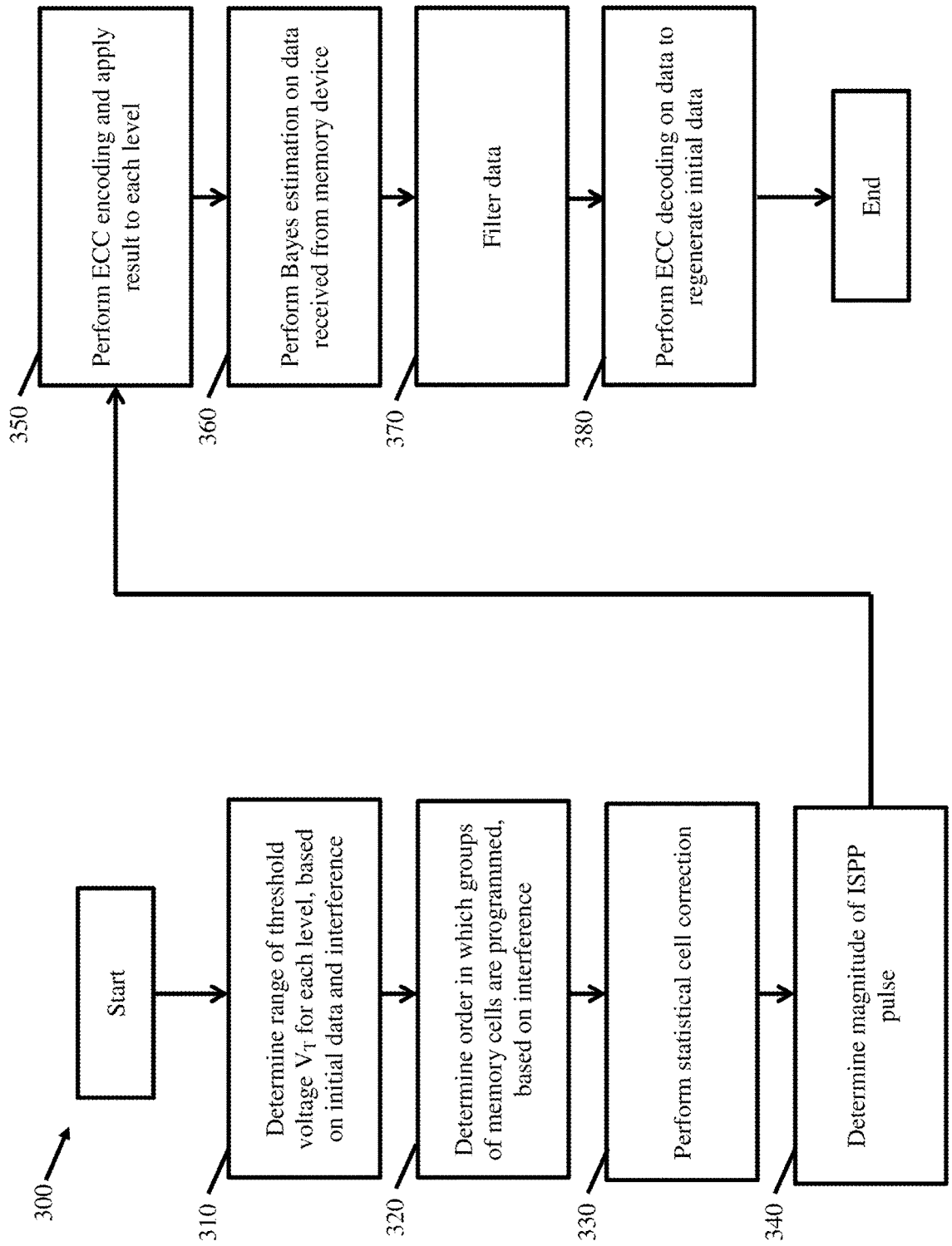
FIG. 3 is a flowchart of a method of controlling a memory device, according to embodiments.

FIG. 3 is a flowchart of a method 300 of controlling a memory device, according to embodiments.

Referring to FIG. 3, the method 300 may be performed by the memory system 200 of FIG. 2.

In operation 310, the range allocation and program order block 211 determines a range of a threshold voltage $V_T$ for each level of each memory cell of the memory device 2000. In detail, the range allocation and program order block 211 receives initial data DATA that may be a binary vector, and converts the initial data DATA to the range of the threshold voltage $V_T$ for each level, to balance an equal amount of errors between each level. The range allocation and program order block 211 determines the range of the threshold voltage $V_T$ for each level of each memory cell, further based on an interference between a word line of each memory cell and its surroundings.

In operation 320, the range allocation and program order block 211 determines an order in which groups of memory cells are programmed. In detail, the range allocation and program order block 211 determines which groups of memory cells of the memory device 2000 are programmed separately in an order of program stages, to minimize cell-to-cell coupling. That is, the range allocation and program order block 211 determines the order in which the groups of the memory cells are programmed, based on inter-cell interference in each bit line, ready-for-verify interference in each word line, and pillar interference on a z-axis, to mitigate such interferences.

In operation 330, the statistical cell correction block 212 performs statistical cell correction on the range of the threshold voltage $V_T$ for each level of each memory cell that is determined by the range allocation and program order block 211. In detail, the statistical cell correction block 212 determines an actual threshold voltage $V_T$ of each level of each memory cell of the memory device 2000, based on a read reference READ REF that is received from the memory device 2000. The read reference READ REF indicates a positive movement or increase of the threshold voltage $V_T$ of at least one level of at least one memory cell, and a previous program pulse that is applied to each level of each memory cell. The statistical cell correction block 212 further determines a negative movement or decrease (i.e., a retention rate) of the threshold voltage $V_T$ of at least one level of at least one memory cell, between program pulses that are applied to each level of each memory cell.

The statistical cell correction block 212 further determines an additional program pulse to be applied to at least one level of at least one memory cell of the memory device 2000 that is predicted for shifting respectively of the actual threshold voltages $V_T$, based on the determined actual threshold voltage $V_T$ of each level of each memory cell of the memory device 2000, the determined negative movement of the threshold voltage $V_T$ of each level, and the range of the threshold voltage $V_T$ for each level of each memory cell that is determined by the range allocation and program order block 211. In this way, the statistical cell correction block 212 determines whether the additional program pulse is added to each level of each memory cell such that each level is over its range of the threshold voltage $V_T$. The statistical cell correction block 212 may further calculate the additional program pulse to be applied to at least one level of at least one memory cell, further based on the order in which the groups of the memory cells are programmed that is determined by the range allocation and program order block 211.

In operation 340, the ISPP tuner and ECC encoder block 213 determines a magnitude of an ISPP pulse to be applied to each level of each memory cell of the memory device 2000, based on a verify signal VERIFY and the respective additional program pulse determined by the statistical cell correction block 212, to achieve a minimum bit error rate (BER). The verify signal VERIFY is received from the memory device 2000 and indicates whether each level of each memory cell reached its range of the threshold voltage $V_T$.

In operation 350, the ISPP tuner and ECC encoder block 213 performs ECC encoding of the determined magnitude of the ISPP pulse to be applied to each level of each memory cell of the memory device 2000. The ISPP tuner and ECC encoder block 213 then applies the ECC-encoded magnitude of the ISPP pulse, to each level of each memory cell.

In operation 360, the Bayes estimation block 214 performs a Bayes estimation on data that is received from the memory device 2000, to remove noise from the data. The Bayes estimation block 214 may perform the Bayes estimation, based on the read reference READ REF that is received from the memory device 2000.

In operation 370, the filter block 215 filters the data on which the Bayes estimation is performed, to remove bit redundancy from the data. The filter block 215 may include, for example, a Kalman filter or a Weiner filter. The filter block 215 may filter the data on which the Bayes estimation is performed, based on the read reference READ REF that is received from the memory device 2000.

In operation 380, the ECC decoder block 216 performs an ECC decoding of the data that is filtered, to regenerate the initial data DATA.

According to embodiments, the method 300 of the memory system 200 enables reliable storage of many levels (e.g., 64 levels) per memory cell. The method 300 of the memory system 200 further reduces a BER compared to conventional memory systems.

Figure 4:
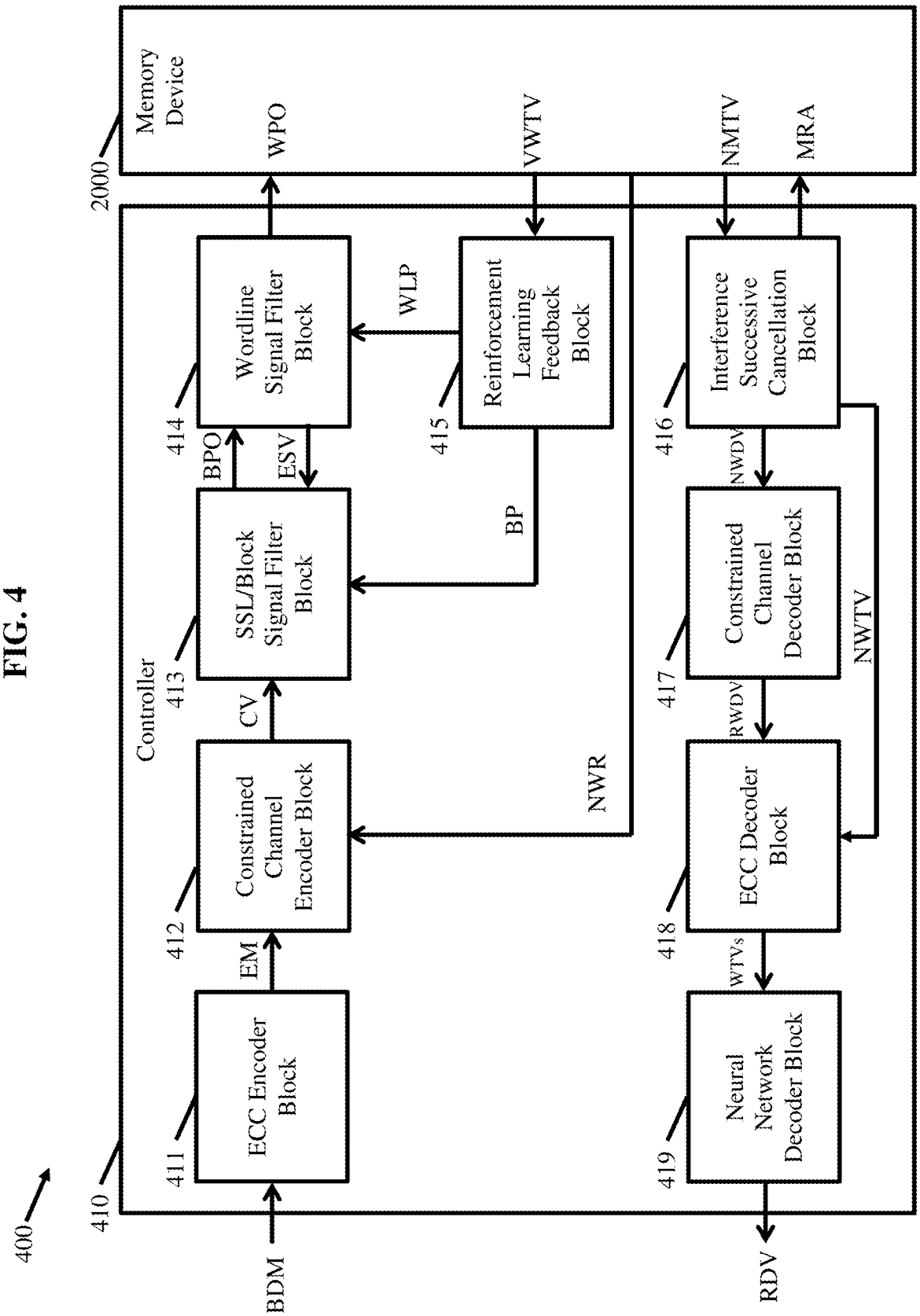
FIG. 4 is a block diagram of a memory system according to embodiments.

FIG. 4 is a block diagram of a memory system 400 according to embodiments.

Referring to FIG. 4, the memory system 400 includes a controller 410 and the memory device 2000. The controller 410 includes an ECC encoder block 411, a constrained channel encoder block 412, an SSL/block signal filter block 413, a wordline signal filter block 414, a reinforcement learning feedback block 415, an interference successive cancellation block 416, a constrained channel decoder block 417, an ECC decoder block 418 and a neural network decoder block 419.

The ECC encoder block 411 receives a block-size data matrix (BDM), and performs ECC encoding on the block-size data matrix to generate an encoded matrix (EM).

The constrained channel encoder block 412 receives, from the memory device 2000, a next wordline (WL) read (NWR) from the memory device before programming the memory device 2000 with one or more pulses, and performs constrained channel encoding on the encoded matrix, based on the next wordline read, to generate a constrained vector (CV).

The SSL/block signal filter block 413 receives, from the wordline signal filter block 414, an error statistics vector (ESV), and receives, from the reinforcement learning feedback block 415, a block policy (BP). The block policy includes options for a memory block of the memory device 2000 including a target WL location at which one or more pulses may be programmed. The SSL/block signal filter block 413 further performs SSL/block signal filtering on the constrained vector, based on the error statistics vector and the block policy, to generate a block programming order (BPO) for the memory block including the target WL location.

The wordline signal filter block 414 generates the error statistics vector (ESV) and receives a WL policy (WLP) from the reinforcement learning feedback block 415. The WL policy includes options for an inhibit vector and a pulse to be applied to the target WL location. The wordline signal filter block 414 further performs wordline signal filtering on the block programming order, based on the WL policy, to generate a WL programming order (WPO) for the target WL location, the WL programming order including the inhibit vector and the pulse to be applied to the target WL location. The wordline signal filter block 414 transmits the WL programming order to the memory device 2000.

The memory device 2000 generates the next WL read and a verify WL voltage threshold vector (VWTV). The verify WL voltage threshold vector indicates a voltage threshold of each WL in the memory device 2000.

The reinforcement learning feedback block 415 generates the block policy and WL policy, based on the verify WL voltage threshold vector.

The interference successive cancellation block 416 receives a noisy multi-WL threshold voltage vector (NMTV) from the memory device 2000. The noisy multi-WL threshold voltage vector indicates a threshold voltage of each WL in the memory device 2000. The interference successive cancellation block 416 further successively cancels interference from the noisy multi-WL threshold voltage vector, using machine learning, to generate a noisy WL data vector (NWDV) for a WL in the memory device 2000. The interference successive cancellation block 416 further generates and transmits multi-round requests for averaging (MRA) to the memory device 2000. The interference successive cancellation block 416 further generates and transmits a noisy WL threshold voltage vector (NWTV) for the WL in the memory device 2000, to the ECC decoder block 418.

The constrained channel decoder block 417 performs constrained channel decoding on the noisy WL data vector to generate a recovered WL data vector (RWDV) for the WL in the memory device 2000.

The ECC decoder block 418 performs ECC decoding on the recovered WL data vector, based on the noisy WL threshold voltage vector, to generate WL data and threshold vectors (WTVs) for the WL in the memory device 2000.

The neural network decoder block 419 performs neural network decoding on the WL data and threshold vectors to generate a recovered data vector (RDV) for the WL in the memory device 2000.

Figure 5:
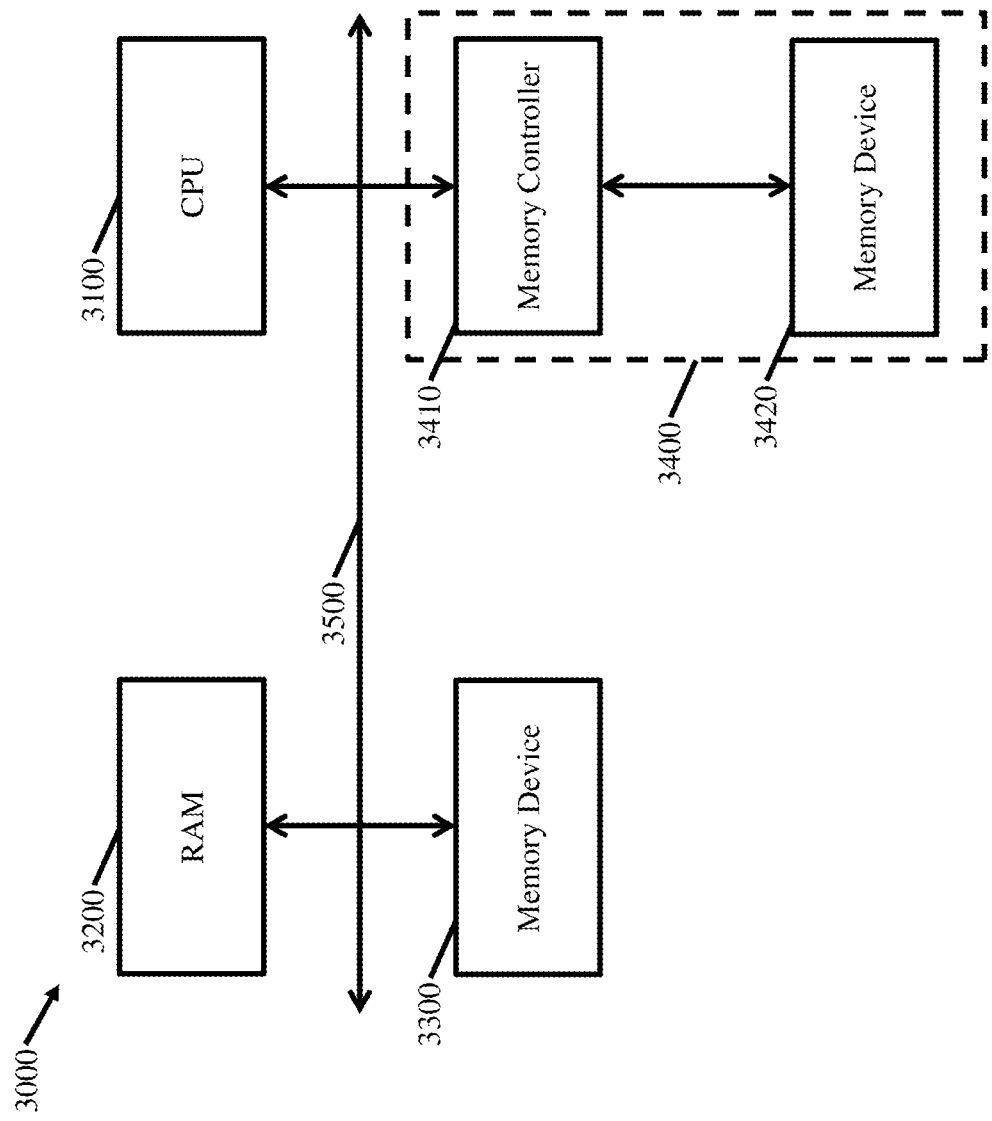
FIG. 5 is a block diagram of computer system including a memory system according to embodiments.

FIG. 5 is a block diagram of a computer system 3000 including a memory system according to embodiments. The computer system 3000, such as a mobile device, a desktop computer, and a server, may employ a memory system 3400 according to embodiments of the inventive concepts.

The computer system 3000 may include a central processing unit 3100, a RAM 3200, a user interface 3300, and the memory system 3400, are electrically connected to buses 3500. The host as described above may include the central processing unit 3100, the RAM 3200, and the user interface 3300 in the computer system 3000. The central processing unit 3100 may control the entire computer system 3000 and may perform calculations corresponding to user commands input via the user interface 3300. The RAM 3200 may function as a data memory for the central processing unit 3100, and the central processing unit 3100 may write/read data to/from the memory system 3400.

As in example embodiments of inventive concepts described above, the memory system 3400 may include a memory controller 3410 and a memory device 3420. The memory controller 3410 may include an encoder and a decoder, and the memory device 3420 may include a cell array including a plurality of memory cells.

According to embodiments of the inventive concepts, the memory controller 3410 may be implemented by the memory controller 1000 or 210 discussed above with reference to FIGS. 1 and 2 and the memory device 3420 may be implemented by the memory device 2000 discussed above with reference to FIGS. 1 and 2.

Figure 6:
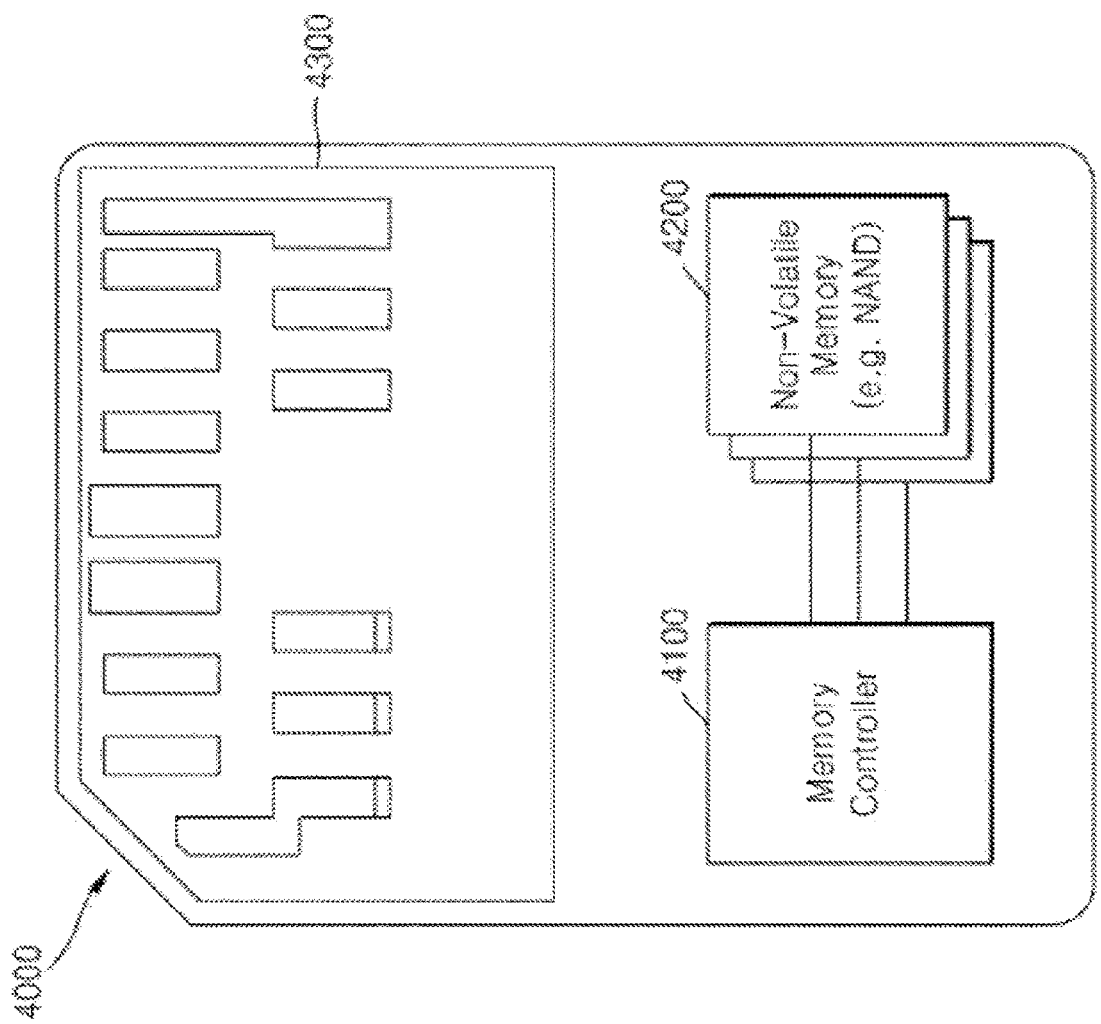
FIG. 6 is a block diagram of a memory card according to embodiments.

FIG. 6 is a block diagram showing a memory card 4000 according to embodiments. The memory system 900 or 200 according to example embodiments of inventive concepts discussed above with reference to FIGS. 1 and 2 may be the memory card 4000. For example, the memory card 4000 may include an embedded multimedia card (eMMC) or a secure digital (SD) card. As shown in FIG. 6, the memory card 4000 may include a memory controller 4100, a non-volatile memory 4200, and a port region 4300. The memory controller 4100 may be implemented by the controller 1000 or 210 discussed above with reference to FIGS. 1 and 2, and the non-volatile memory 4200 shown in FIG. 6 may be implemented by the memory device 2000 discussed above with reference to FIGS. 1 and 2.

The memory controller 4100 may include an encoder and a decoder. The encoder and the decoder may perform an encoding method and a decoding method according to example embodiments of inventive concepts. The memory controller 4100 may communicate with an external host via the port region 4300 in compliance with a pre-set protocol. The protocol may be eMMC protocol, SD protocol, SATA protocol, SAS protocol, or USB protocol. The non-volatile memory 4200 may include memory cells which retain data stored therein even if power supplied thereto is blocked. For example, the non-volatile memory 4200 may include a flash memory, a magnetic random access memory (MRAM), a resistance RAM (RRAM), a ferroelectric RAM (FRAM), or a phase change memory (PCM).

According to embodiments of the inventive concepts, the memory controller 4100 and the non-volatile memory 4200 may be implemented, respectively, by the memory controller 1000 or 210 and a memory device 2000 discussed above with reference to FIGS. 1 and 2.

Figure 7:
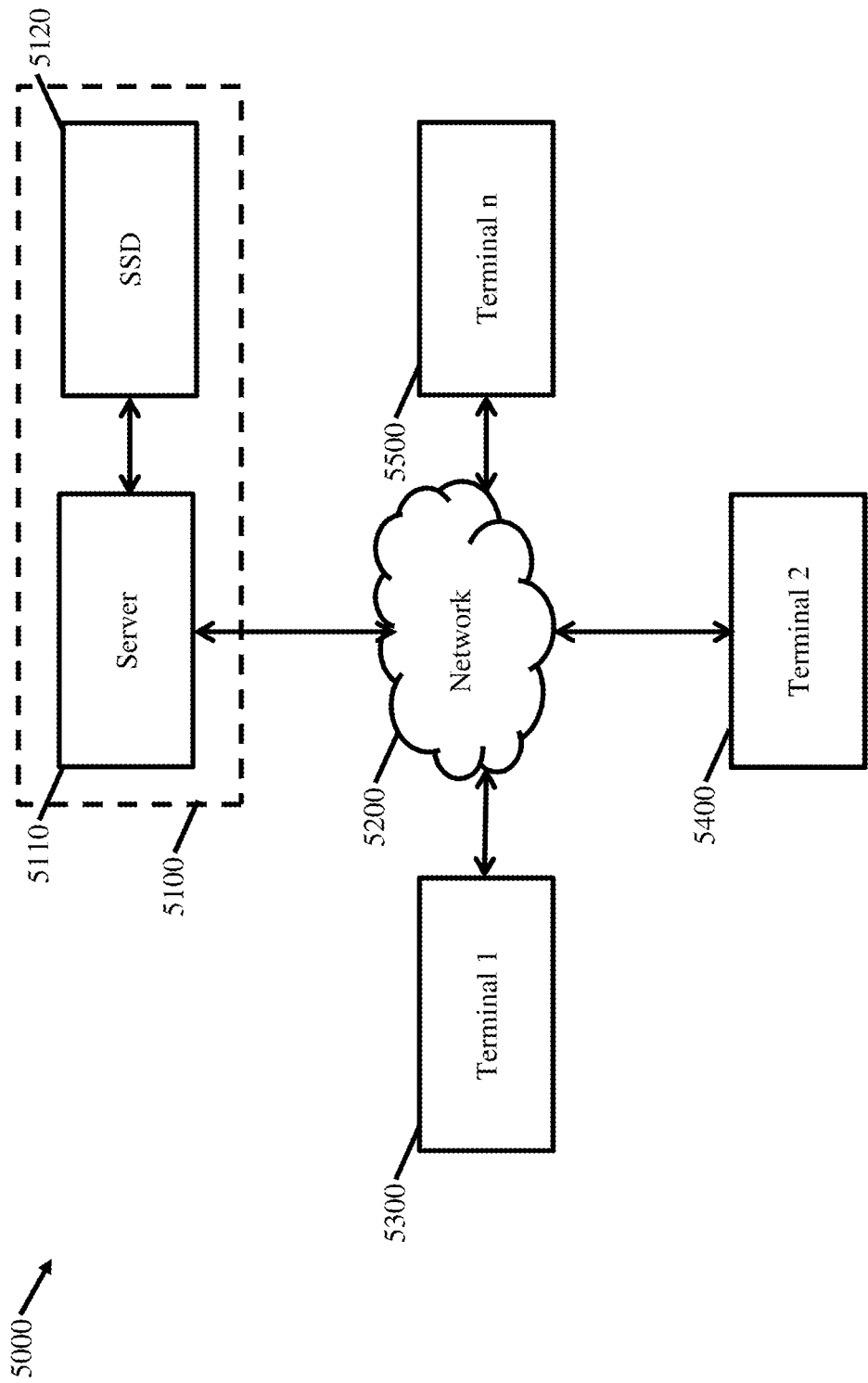
FIG. 7 is a block diagram of a network system including a memory system according to embodiments.

FIG. 7 is a block diagram of a network system 5000 including a memory system according to embodiments. As shown in FIG. 7, the network system 5000 may include a server system 5100 and a plurality of terminals 5300, 5400, and 5500 that are connected via a network 5200. The server system 5100 may include a server 5110 for processing requests received from the plurality of terminals 5300, 5400, and 5500 connected to the network 5200 and an SSD 5120 for storing data corresponding to the requests received from the terminals 5300, 5400, and 5500. Here, the SSD 5120 may be a memory system according to embodiments of the inventive concepts.

According to embodiments of the inventive concepts, SSD 5120 may be implemented by the memory system 900 or 200 discussed above with reference to FIGS. 1 and 2.

Meanwhile, a memory system according to example embodiments of inventive concepts may be mounted via any of various packages. For example, a memory system according to embodiments of the inventive concepts may be mounted via any of packages including package on package (PoP), ball grid arrays (BGAs), chip scale packages (CSPs), plastic leaded chip Carrier (PLCC), plastic dual in-line package (PDIP), die in waffle pack, die in wafer form, chip on board (COB), ceramic dual in-line package (CERDIP), plastic metricquad flat pack (MQFP), thin quad flatpack (TQFP), small outline (SOIC), shrink small outline package (SSOP), thin small outline (TSOP), thin quad flatpack (TQFP), system in package (SIP), multi chip package (MCP), wafer-level fabricated package (WFP), wafer-level processed stack package (WSP), etc.

As is traditional in the field of the inventive concepts, the embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

The various operations of methods described above may be performed by any suitable means capable of performing the operations, such as various hardware and/or software component(s), circuits, and/or module(s).

The software may include an ordered listing of executable instructions for implementing logical functions, and can be embodied in any "processor-readable medium" for use by or in connection with an instruction execution system, apparatus, or device, such as a single or multiple-core processor or processor-containing system.

The blocks or steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

The foregoing is illustrative of the embodiments and is not to be construed as limiting thereof. Although a few embodiments have been described, those skilled in the art will readily appreciate that many modifications are possible in the embodiments without materially departing from the present inventive concept.

The invention claimed is:

1. A high-density storage system comprising:
a memory device comprising memory cells; and
a controller comprising:
 a range allocation and program order block configured to:
  determine a range of a threshold voltage for each level of each memory cell of the memory device, based on initial data and an interference in the memory device; and
  determine an order in which groups of the memory cells of the memory device are programmed, based on the interference;
 a statistical cell correction block configured to perform statistical cell correction on the range of the threshold voltage for each level of each memory cell, based on the order in which the groups of the memory cells are programmed and reference information of each level of each memory cell of the memory device that is received from the memory device;
 an incremental step pulse programming (ISPP) tuner and error correction code (ECC) encoder block configured to:
  determine a magnitude of an ISPP pulse to applied to each level of each memory cell of the memory device, based on a result of the statistical cell correction that is performed;
  perform ECC encoding on the magnitude of the ISPP pulse to be applied to each level of each memory cell; and
  apply, to each level of each memory cell of the memory device, the magnitude of the ISPP pulse on which the ECC encoding is performed.

2. The high-density storage system of claim 1, wherein the controller further comprises:
a Bayes estimation block configured to perform a Bayes estimation on received data from the memory device;
a filter block configured to filter the received data on which the Bayes estimation is performed; and
an ECC decoder block configured to perform ECC decoding on the received data that is filtered, to regenerate the initial data.

3. The high-density storage system of claim 2, wherein the filter block comprises a Kalman filter or a Weiner filter.

4. The high-density storage system of claim 1, wherein the statistical cell correction block is further configured to:

determine an actual threshold voltage of each level of each memory cell of the memory device, based on the reference information;

determine a decrease of the threshold voltage of at least one level of at least one memory cell of the memory device, based on the actual threshold voltage of each level of each memory cell of the memory device; and determine, as the result of the statistical cell correction, an additional program pulse to be applied to the at least one level of which the decrease of the threshold voltage is determined, based on the actual threshold voltage of each level of each memory cell, the range of the threshold voltage for each level of each memory cell, and the order in which the groups of the memory cells are programmed.

5. The high-density storage system of claim 1, wherein the ISPP tuner and ECC encoder block is further configured to determine the magnitude of the ISPP pulse to be applied to each level of each memory cell, further based on a verify signal indicating whether each level of each memory cell of the memory device reaches the range of the threshold voltage.

6. The high-density storage system of claim 1, wherein the interference comprises one or more predetermined values or is determined via machine learning, for any one or any combination of each bit line, each word line and a z-axis of the memory device.

7. The high-density storage system of claim 1, wherein the controller is further configured to perform periodic data refresh, and the high-density storage system comprises a constant connection to a power source.

8. The high-density storage system of claim 1, further comprising:

a reinforcement learning feedback is configured to generate a block policy and a wordline (WL) policy to be used to determine the magnitude of the ISPP pulse to applied to each level of each memory cell of the memory device, based on a verify WL voltage threshold vector that is received from the memory device;

an interference successive cancellation block configured to successively cancel an interference from a noisy multi-WL threshold voltage vector that is received from the memory device, using machine learning, to generate a noisy WL data vector for a WL in the memory device; and a neural network decoder block configured to perform neural network decoding on WL data and threshold vectors that are generated based on the noisy WL data vector, to generate a recovered data vector for the WL in the memory device.

9. A method of controlling a high-density storage system, the method comprising:

determining a range of a threshold voltage for each level of each memory cell of a memory device, based on initial data and an interference in the memory device;

determining an order in which groups of memory cells of the memory device are programmed, based on the interference;

performing statistical cell correction on the range of the threshold voltage for each level of each memory cell, based on the order in which the groups of the memory cells are programmed and reference information of each level of each memory cell of the memory device that is received from the memory device;

determining a magnitude of an incremental step pulse programming (ISPP) pulse to applied to each level of each memory cell of the memory device, based on a result of the statistical cell correction that is performed;

performing error correction code (ECC) encoding on the magnitude of the ISPP pulse to be applied to each level of each memory cell; and applying, to each level of each memory cell of the memory device, the magnitude of the ISPP pulse on which the ECC encoding is performed.

10. The method of claim 9, further comprising:

performing a Bayes estimation on received data from the memory device;

filtering the received data on which the Bayes estimation is performed; and performing ECC decoding on the received data that is filtered, to regenerate the initial data.

11. The method of claim 10, wherein the filtering is performed using a Kalman filter or a Weiner filter.

12. The method of claim 9, wherein the performing the statistical cell correction comprises:

determining an actual threshold voltage of each level of each memory cell of the memory device, based on the reference information;

determining a decrease of the threshold voltage of at least one level of at least one memory cell of the memory device, based on the actual threshold voltage of each level of each memory cell of the memory device; and determining, as the result of the statistical cell correction, an additional program pulse to be applied to the at least one level of which the decrease of the threshold voltage is determined, based on the actual threshold voltage of each level of each memory cell, the range of the threshold voltage for each level of each memory cell, and the order in which the groups of the memory cells are programmed.

13. The method of claim 9, wherein the determining of the magnitude of the ISPP pulse to be applied to each level of each memory cell comprises determining the magnitude of the ISPP pulse to be applied to each level of each memory cell, further based on a verify signal indicating whether each level of each memory cell of the memory device reaches the range of the threshold voltage.

14. The method of claim 9, wherein the interference comprises one or more predetermined values or is determined via machine learning, for any one or any combination of each bit line, each word line and a z-axis of the memory device.

15. A non-transitory computer-readable storage medium storing instructions to cause a processor to:

determine a range of a threshold voltage for each level of each memory cell of a memory device, based on initial data and an interference in the memory device;

determine an order in which groups of memory cells of the memory device are programmed, based on the interference;

perform statistical cell correction on the range of the threshold voltage for each level of each memory cell, based on the order in which the groups of the memory cells are programmed and reference information of each level of each memory cell of the memory device that is received from the memory device;

determine a magnitude of an incremental step pulse programming (ISPP) pulse to applied to each level of each memory cell of the memory device, based on a result of the statistical cell correction that is performed;

perform error correction code (ECC) encoding on the magnitude of the ISPP pulse to be applied to each level of each memory cell; and apply, to each level of each memory cell of the memory device, the magnitude of the ISPP pulse on which the ECC encoding is performed.

16. The non-transitory computer-readable storage medium of claim 15, wherein the instructions further cause the processor to:
perform a Bayes estimation on received data from the memory device;
filter the received data on which the Bayes estimation is performed; and
perform ECC decoding on the received data that is filtered, to regenerate the initial data.

17. The non-transitory computer-readable storage medium of claim 16, wherein the instructions further cause the processor to filter the received data on which the Bayes estimation is performed, using a Kalman filter or a Weiner filter.

18. The non-transitory computer-readable storage medium of claim 15, wherein the instructions further cause the processor to:
determine an actual threshold voltage of each level of each memory cell of the memory device, based on the reference information;
determine a decrease of the threshold voltage of at least one level of at least one memory cell of the memory device, based on the actual threshold voltage of each level of each memory cell of the memory device; and
determine, as the result of the statistical cell correction, an additional program pulse to be applied to the at least one level of which the decrease of the threshold voltage is determined, based on the actual threshold voltage of each level of each memory cell, the range of the threshold voltage for each level of each memory cell, and the order in which the groups of the memory cells are programmed.

19. The non-transitory computer-readable storage medium of claim 15, wherein the instructions further cause the processor to determine the magnitude of the ISPP pulse to be applied to each level of each memory cell, further based on a verify signal indicating whether each level of each memory cell of the memory device reaches the range of the threshold voltage.

20. The non-transitory computer-readable storage medium of claim 15, wherein the interference comprises one or more predetermined values or is determined via machine learning, for any one or any combination of each bit line, each word line and a z-axis of the memory device.

* * * * *